United States Patent
Iwamoto

[11] Patent Number: 6,019,274
[45] Date of Patent: Feb. 1, 2000

[54] SEMICONDUCTOR DEVICE AND MOUNTING METHOD THEREFOR

[75] Inventor: Naofumi Iwamoto, Tokyo, Japan

[73] Assignee: Oki Electric Industry Co., Ltd., Tokyo, Japan

[21] Appl. No.: 08/857,865

[22] Filed: May 16, 1997

[30] Foreign Application Priority Data

Sep. 5, 1996  [JP]  Japan .................................. 8-234826

[51] Int. Cl.[7] ........................... B23K 31/02; B23K 35/12
[52] U.S. Cl. ................................ 228/180.21; 228/235.1; 228/255
[58] Field of Search .............. 228/180.21, 212, 228/235.1, 255, 179.1, 180.1

[56] References Cited

U.S. PATENT DOCUMENTS

| | | | |
|---|---|---|---|
| 4,396,140 | 8/1983 | Jaffe et al. | 228/123 |
| 5,060,846 | 10/1991 | Schaeffer et al. . | |
| 5,197,652 | 3/1993 | Yamazaki | 228/44.7 |
| 5,271,147 | 12/1993 | Ogata | 29/827 |
| 5,329,158 | 7/1994 | Lin | 257/666 |
| 5,361,966 | 11/1994 | Kanbe et al. | 228/123.1 |
| 5,390,079 | 2/1995 | Aomori et al. | 361/749 |
| 5,501,004 | 3/1996 | Onitsuka | 29/827 |
| 5,673,479 | 10/1997 | Hawthorne | 29/832 |
| 5,743,459 | 4/1998 | Urushima | 228/180.21 |
| 5,815,919 | 10/1998 | Nakanishi et al. | 29/840 |
| 5,817,208 | 10/1998 | Nose et al. | 156/500 |

FOREIGN PATENT DOCUMENTS

| | | |
|---|---|---|
| 0463788 A2 | 6/1991 | European Pat. Off. . |
| 4204882 A1 | 8/1993 | Germany . |
| 4-315494 | 6/1992 | Japan . |
| 6-13429 | 1/1994 | Japan . |
| 6-196610 | 7/1994 | Japan . |
| 8-008352 | 1/1996 | Japan . |

OTHER PUBLICATIONS

"Fine Pitch Attachment Process Using A Polymide–Solder Preform," IBM Technical Disclosure Bulletin, vol. 33, No. 1A, pp. 401–402, Jun. 1990.

"Constant Heat–Soldering Method Using Metal Wire," IBM Technical Disclosure Bulletin, vol. 39, No. 4, pp. 103–104, Apr. 1996.

Primary Examiner—Patrick Ryan
Assistant Examiner—Kiley Stoner
Attorney, Agent, or Firm—Rabin & Champagne, P.C.

[57] ABSTRACT

A reflow mounting method and a semiconductor device for efficient manufacture of TCPs superior in reliability by preventing the deformation of leads and ensuring a dependable contact between the bonding pads on a circuit board and the leads, wherein metal pieces arranged as weights on the leads are temporarily positioned adequately to specified bonding pads, thus restraining the leads from shifting from appropriate positions, which may occur if the leads deform, and wherein the metal pieces become wettable by bonding agent when heated, thus making sure that the leads are firmly fixed between the metal pieces and the bonding pads.

17 Claims, 6 Drawing Sheets

SEMICONDUCTOR DEVICE AND MOUNTING METHOD THEREFOR

BACKGROUND OF THE INVENTION

1. Field of the Invention

The present invention relates to a semiconductor device, such as an IC package, and a method of mounting this semiconductor device on a circuit board, and more particularly to a tape carrier package in which an IC chip is held on a film carrier, and also to a method of mounting this tape carrier package.

2. Prior Art

The conventional tape carrier package (hereafter referred to as a TCP for short) has a structure as follows.

Figure 2A:
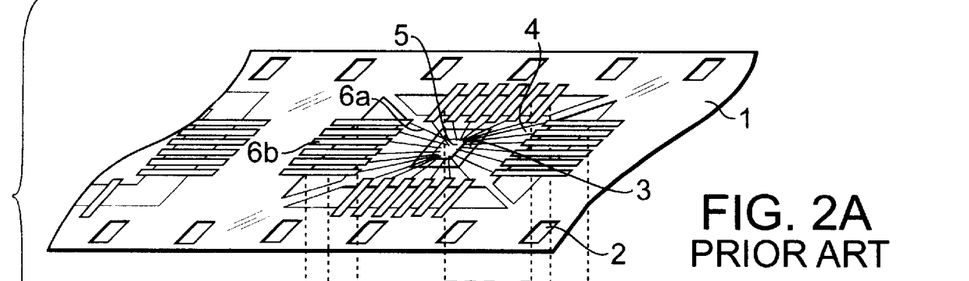
FIG. 2(a) is a general perspective view of a TCP formed on a carrier tape.
Figure 2B:
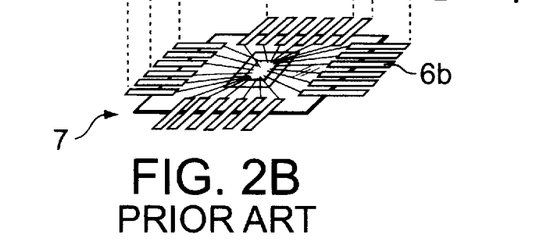
FIG. 2(b) is a perspective view showing a TCP punched out from the tape carrier.
Figure 3:
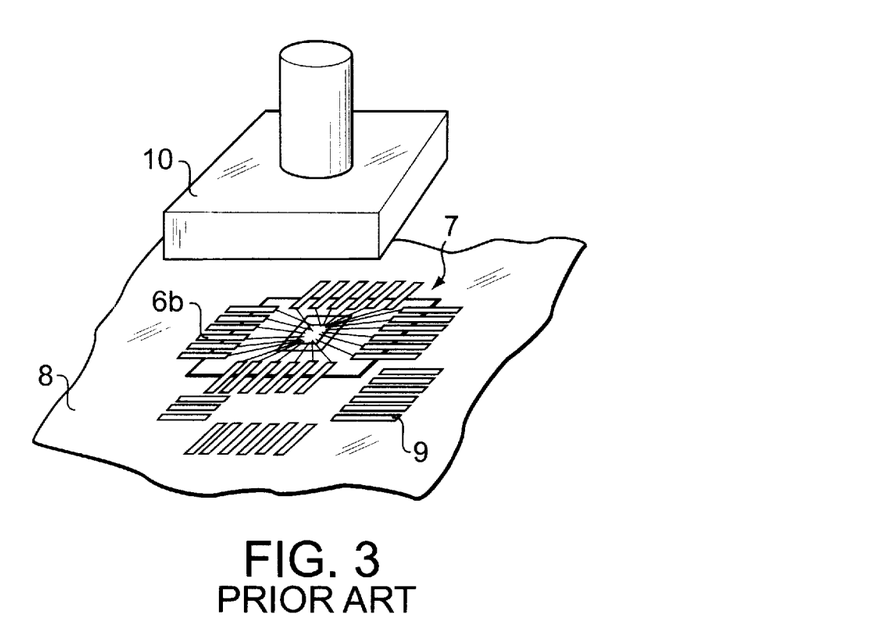
FIG. 3 is a perspective view of a TCP showing a conventional mounting method using a bonding tool.

FIG. 2 shows the structure of a conventional TCP, wherein FIG. 2(a) is a general perspective view of a TCP formed on a carrier tape, and FIG. 2(b) is a perspective view showing a TCP punched out from the tape carrier. FIG. 3 is a perspective view showing a method whereby a punched-out TCP is mounted on a circuit board.

As shown in FIG. 2(a), positioning holes 2, such as sprocket holes are formed in a tape 1. The tape 1 has a base film portion 4 with a device hole 3 formed therein. In the device hole 3, there is arranged an IC chip 5, which has a plurality of connection terminals provided therein.

The connection terminals of the IC chip 5 are connected to corresponding inner leads 6a, which extend from the base film into the device hole 3, and thus the IC chip 5 is held to the base film. Outer leads 6b extending beyond the base film portion 4 are at the outer ends opposite the inner leads 6a.

The inner leads 6a and the corresponding outer leads 6b are formed as one-piece bodies by patterning a metal foil.

The base film portion 4 is punched out from the tape 1 along with the leads 6b, which extend outward from the base film portion 4. Thus, a TCP 7 is formed as shown in FIG. 2(b). The TCP 7 has the IC chip 5 and the inner leads 6a covered with a resin material when necessary.

The TCP 7 punched out from the tape 1 is fixed to a circuit board 8 formed of a glass epoxy material or a glass material as shown in FIG. 3. To fix TCP 7 to the circuit board, the leads 6b of TCP 7 are located on bonding pads 9 of the circuit board 8.

Subsequently, the bonding pads 9 and the leads 6b, which have a bonding agent, such as solder or an anisotropic conductive film (not shown) placed therebetween, are subjected to thermocompression by a bonding tool 10, whereby the mounting of TCP 7 to the circuit board 8 is completed.

In the mounting method using the above-mentioned bonding tool 10, however, various types of bonding tools 10 need to be prepared, so that the best suited type can be selected according to the size and the shape of a TCP 7 to be mounted.

It is also required to reciprocate a bonding tool 10 in each mounting work of a TCP 7, and in the mounting method using this bonding tool 10, it is difficult to improve the work efficiency.

The reflow mounting method using a reflow oven is one of the mounting methods that permit high work efficiency by continuous work.

According to this reflow mounting method, the workpieces having their bonding pads smeared or plated with a solder in advance are continuously transferred to the reflow oven and as they go through the heating zone of the reflow oven, continuous bonding is performed.

However, the outer leads 6b of TCP 7 are formed of metal foil with a thin thickness about of 18 to 35 μm.

Figure 4A:
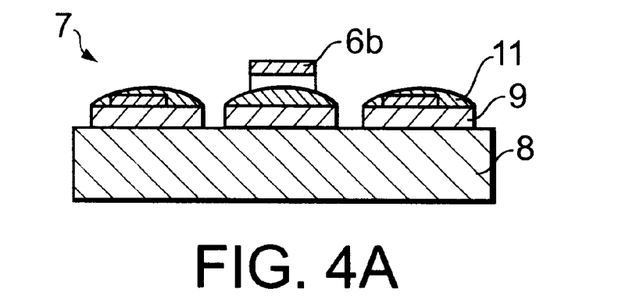
FIGS. 4(a) to 4(d) are sectional views showing a conventional TCP for explaining problems.
Figure 4B:
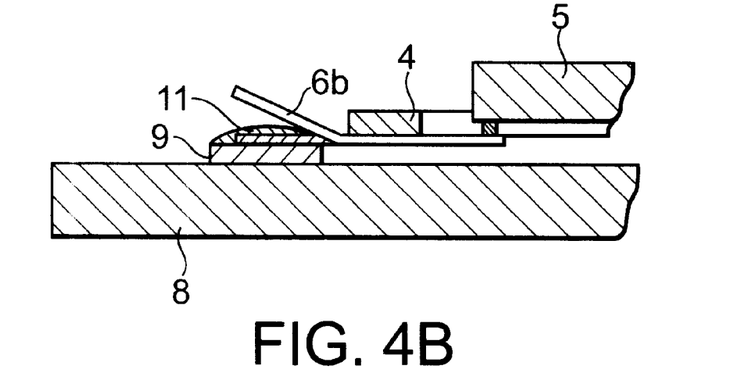

Therefore, when the conventional reflow mounting method is applied to TCP 7 with such thin leads 6b, as shown in FIG. 4(a), the thin outer leads 6b are likely to be so deformed as to become separated from the bonding agent 11, and it occasionally happens that due to this deformation, the outer leads 6b are not bonded to the bonding areas 9 of the circuit board 8. Or, as shown in FIG. 4(b), a loose bonding will result from displacement caused by the deformation of the outer leads 6b.

Figure 4C:
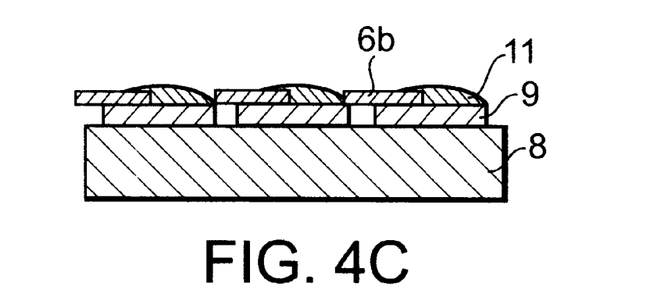
Figure 4D:
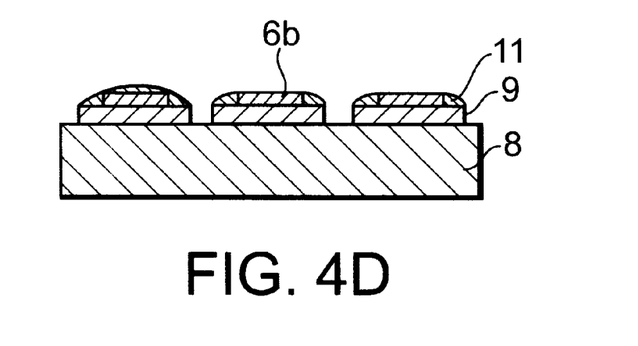

There is a possibility that spoiled work occurs by a short-circuit to neighboring outer leads 6b, as shown in FIG. 4(c), due to displacement of the whole of the IC chip 5, which has light-weight outer leads 6b, caused by vibration or the like while the workpiece is being transferred to the reflow oven.

Furthermore, the leads 6b of TCP 7 are generally solder-plated or tin-plated to increase the wettability by solder for solder bonding. However, as the leads 6b of degrade in wettability with time, it has sometimes been difficult to have the top surface of the leads 6b sufficiently smeared with solder, making it impossible to obtain a required bonding strength.

SUMMARY OF THE INVENTION

The present invention has been made to remove the above-noted problems, and has as its object to provide a reflow mounting method and a TCP suitable for this reflow mounting method for efficient manufacture of TCPs superior in reliability by preventing the deformation of leads and thereby ensuring a contact of the leads with the bonding pads on a circuit board.

In order to solve the above-noted problems, the present invention adopts a structure as follows.

According to the present invention, there is provided a tape carrier package mounting method of fixing a tape carrier package, including an IC chip and a film having a plurality of leads mounted thereon, to a circuit board, which has provided thereon bonding pads corresponding to the leads, by connecting the leads to the bonding pads, wherein the IC chip has a plurality of connection terminals to be connected to the leads, and is fixed on the film, comprising the steps of:

arranging a meltable bonding agent to the bonding pads on the circuit board;

arranging as weights metal pieces, likely to be wetted by the bonding agent, on the leads when the bonding agent is heated, to temporarily position the leads to the corresponding bonding pads;

passing the package and the circuit board together as one body through a heating zone to temporarily heat the bonding agent under the condition that the leads are positioned temporarily by the metal pieces; and fixing the leads together with the metal pieces to the corresponding bonding parts as the bonding agent solidifies.

In the present invention, the leads are temporarily fixed to predetermined bonding pads adequately by the work of the weights of the metal pieces arranged on the leads, so that the leads are restrained from shifting from appropriate positions by deformation or the like when the workpieces are being transferred to the heating zone or when the heating zone is moving. Because, when heated, the bonding agent is likely to wet the metal piece, the bonding agent, when it solidifies, securely forms a fillet covering the lead between the metal piece and the bonding pad, and thereby the lead is fixed securely.

Therefore, according to the present invention, the bonding pads and the leads are reliably connected.

For the bonding agent, for example, a solder such as a solder paste, a silver paste or tin-lead alloy, may be used.

By using a holding plate for holding a plurality of metal pieces so as to correspond to the leads, the plurality of metal pieces can be arranged on the corresponding leads all at once. The weight of the holding plate can be utilized for temporary positioning the leads. This makes it possible to reduce the weight of the metal pieces by the amount equivalent to the weight of the holding plate, and therefore the degrees of design freedom in terms of the shape or the like of metal pieces can be raised, so that a shape capable of maintaining a more stable posture can be applied to the metal pieces.

By forming the surface of a metal piece that contacts the lead in a convex spherical shape, a relatively large fillet can be formed covering the lead between the bonding pad and the metal piece regardless of the wettability of the bonding agent to the lead, so that this fillet enables the bonding pad and the lead to be connected firmly.

A pin may be adopted which is used to temporarily fix the holding plate, the film, and the circuit board at positions where they are aligned with one another. The adoption of this pin will facilitate the temporary positioning work, and can securely prevent those components from shifting from the appropriate positions.

The metal pieces can be removably held by the holding plate. After the leads and the bonding pads are respectively connected, the holding plate can be removed, which enables the connection structure to be simplified and reduced in size and weight after a TCP is mounted.

The metal-piece-detachable holding plate can be re-used by attaching new metal pieces to it.

The metal pieces may be formed of a bonding agent, such as solder, for example, which melts by heat and solidifies by a subsequent drop in temperature. The metal pieces being formed by a bonding agent enables a bonding agent and metal pieces to be arranged by a batch job.

Furthermore, the metal pieces may be formed in a dual structure including a core and a shell covering the core. The core may be formed of a metallic material, such as copper, or a nonmetallic material, which does not melt when the bonding material is heated. The shell may be formed of a bonding agent, such as solder, which melts by heat and solidifies by a subsequent drop in temperature.

When a solder composed of a tin-lead alloy, for example, is adopted for the bonding agent, a metal piece highly wettable by this solder may be selected from among copper, gold and silver.

When the above-mentioned solder is composed of a silver paste, silver may be selected as a metal piece with high wettability by this solder.

According to the present invention, there is provided a semiconductor device including an IC chip having a plurality of connection terminals, and a film having the chip fixed thereto and a plurality of leads mounted thereon, wherein the leads are connected to corresponding bonding pads on a circuit board, comprising:

a holding plate for holding a plurality of metal pieces serving as weights placed on the leads when the bonding agent solidifies, to temporarily position the leads on the corresponding bonding pads;

positioning holes provided in the film and the holding plate; and a positioning pin inserted into the positioning hole, the distal end portion of the positioning pin extending from the film and being connected to the circuit board when the semiconductor device is mounted on the circuit board, wherein the holding plate and the film are connected so as to be movable along the pin in a longitudinal direction of the pin.

In the semiconductor device according to the present invention, the holding plate that has a plurality of metal pieces arranged as weights and the film that has the IC chip fixed thereto and the leads mounted thereon are combined together as a unit movable by means of the pin, whereby the mounting work is made easy and the semiconductor device itself is made easy to handle.

BRIEF DESCRIPTION OF THE DRAWINGS

FIG. 1 shows in sectional views the mounting process of a TCP according to a first embodiment of the present invention, in which

FIG. 1(d') is similar to FIG. 1(c), showing a TCP which has undergone a reflow process; and FIG. 1(d") is similar to FIG. 1(d'), showing a one-half portion of a TCP which has undergone the reflow process;

FIG. 2 shows the structure of a conventional TCP, in which

FIG. 5 shows a second embodiment of the present invention, in which

FIG. 8 shows a fifth embodiment of the present invention, in which

DESCRIPTION OF THE PREFERRED EMBODIMENT(S)

Embodiments of the present invention will be described in detail with reference to the accompanying drawings.

FIG. 1 shows in sectional views the mounting process of a TCP according to a first embodiment of the present invention. In the diagrams to be shown in the following, the structure and the functional parts that are the same as in the prior art are designated by the same reference numerals as in FIGS. 1 and 2, and repetitive descriptions will be omitted.

As shown in FIG. 1(*a*), a bonding agent 11, such as a solder paste or solder plating composed of a tin-lead alloy is applied to the bonding pads 9 serving as bonding pads on the circuit board 8 by the same method as in the prior alt.

Then, as shown in FIG. 1(*b*), a TCP that is the same as the one in FIG. 2(*b*) is arranged on the circuit board 8 with the outer leads 6*b* aligned with the corresponding bonding pads 9.

A metal piece 12 is placed on the lead 6*b* on each bonding pad 9 as shown in FIG. 1(*c*). The metal piece 12 functions as a weight on the lead 6*b* composed of a metal foil.

Figure 1A:
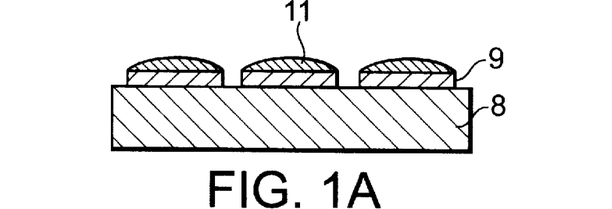
FIG. 1(a) is a sectional view of a TCP showing the process of arranging a bonding agent to bonding pads.
Figure 1B:
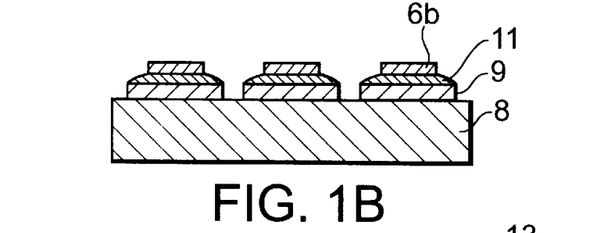
FIG. 1(b) is a sectional view of a TCP showing the process of arranging leads to bonding pads.
Figure 1C:
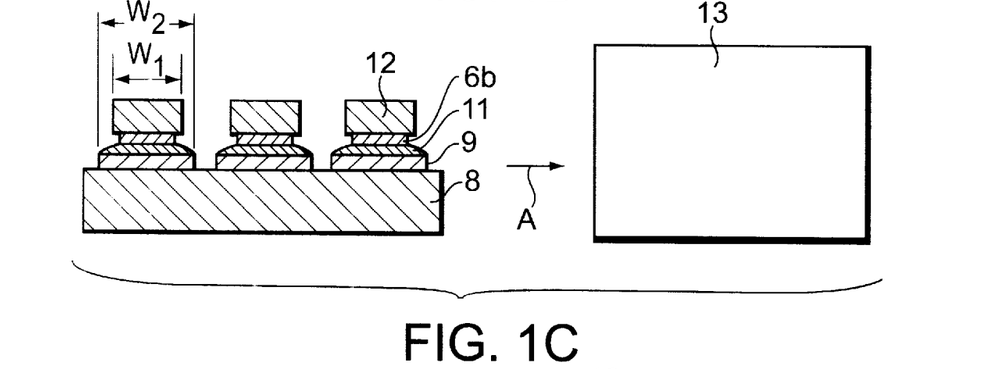
FIG. 1(c) is a sectional view of a TCP showing the process of arranging metal pieces on the leads.

The weight of the metal piece 12 functioning as a weight is set at a value adequate to restrain the deformation or displacement of the lead 6*b* according to the material, and the width or thickness of the outer lead 6*b*. Therefore, the metal piece 12 effectively prevents the lead 6*b* from being displaced from the corresponding bonding pad 9 due to separation or the like of the lead 6*b* or a shift of TCP as a whole.

Figure 1D:
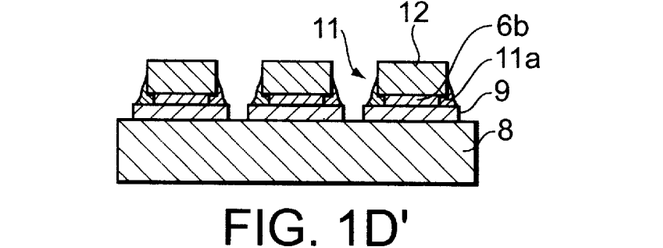

Each metal piece 12 has a width W1 that is not so wide as to contact the adjacent metal piece 12 when metal pieces are placed on the leads 6*b*. The width W1 is preferably less than the width W2 of the bonding pad 9 with the creep-up of molten bonding agent to be described later taken into account. In addition, the length L1 (see FIG. 1(*d*")) of each metal piece 12 is preferably less than the length L2 of the bonding pad 9 in microminiaturization of TCP 7 as a whole.

Further, the height of the metal piece 12 should preferably be smaller so long as the metal piece 12 can function as a weight to ensure that the metal piece 12 does not tilt and its posture is stable while the components are moving in a reflow oven 13 to be described later and also to decrease the weight of TCP 7.

The metal piece 12 is formed of a material likely to be wetted by the bonding agent 11 when the bonding agent 11 is heated. When the bonding agent 11 is formed of silver paste, the metal piece 12 may be composed of silver, for example. When the bonding agent 11 is formed of solder or solder paste, such as a tin-lead alloy, the metal piece 12 may be formed of copper, silver or the like.

As indicated by the arrow A in FIG. 1(*c*), under the condition that the metal pieces 12 are placed on the leads 6*b*, a TCP 7 is transferred in a body with a circuit board 8 underneath to a conventional reflow oven 13, and passes through the heating zone in the reflow oven 13.

As shown in FIGS. 1(*d'*) and 1(*d''*), by a reflow process of heating in the reflow oven 13, the bonding agent 11 composed of solder, for example, melts, creeps up the metal piece 12 and, as it solidifies, forms a fillet 11*a* between the bonding pad 9 and the metal piece 12.

Thus, according to the first embodiment, the bonding pads 9 and the leads 6*b* can be connected together by the bonding agent 11 while the bonding pads 9 of the circuit board 8 and the leads 6*b* are securely kept in contact with one another by the metal pieces 12 on the outer leads, which restrain the leads 6*b* from suffering deformation, such as separation. Even if the lead 6*b* shows a low wettability by the bonding agent 11, a relatively large fillet 11*a* can be formed between the metal piece 12 and the bonding pad 9 by the above-mentioned action of the metal piece 12.

Therefore, since the leads 6*b* are firmly connected and fixed to the bonding pads 9, a highly reliable reflow operation can take place with high efficiency.

A second embodiment of the present invention will be described in the following.

Figure 5A:
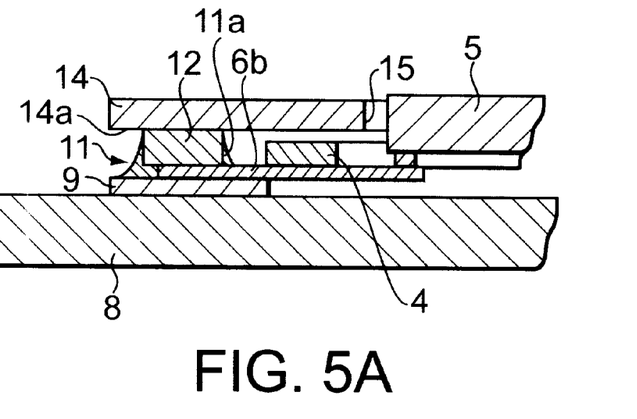
FIG. 5(a) is a sectional view showing the connection between a lead of a TCP and a bonding pad of a circuit board.
Figure 5B:
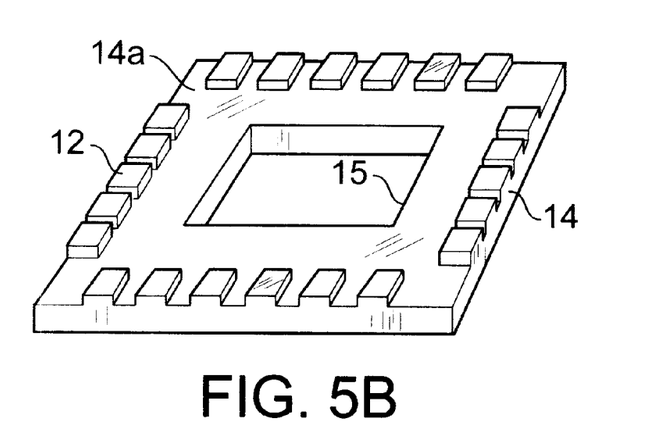
FIG. 5(b) is a perspective view of a holding plate for holding metal pieces, as shown in FIG. 5(a), in a reversed position.

FIG. 5(*a*) is a sectional view showing the connection between a lead 5*b* of TCP 7 and a bonding pad 9 of the circuit board 8, and FIG. 5(*b*) is a perspective view of a holding plate holding metal pieces 12, in a posture reversed from the posture shown in FIG. 5(*a*).

In the first embodiment described above, the metal pieces 12 were placed respectively on the leads 6*b*. In contrast, in the second embodiment, a plurality of metal pieces 12 are collectively arranged on the corresponding leads 6*b* by using a holding plate 14 on which the metal pieces 12 are arranged at predetermined intervals.

The holding plate 14 is a frame having a hole 15 for accepting an IC chip 5. On one surface facing the circuit board 8, there are arranged a plurality of metal pieces 12 corresponding to the leads 6*b*.

Therefore, by arranging the holding plate 14 in a predetermined posture so that the holding plate holding the metal pieces 12 surrounds the circuit board 8, all the metal pieces 12 can be collectively arranged at once. For this reason, the time needed for arranging the metal pieces 12 at predetermined positions can be shortened, so that the mounting efficiency can further be improved.

Moreover, the weight of the holding plate 14 itself can be utilized to add weight to the outer leads 6*b*. Accordingly, the weight of the metal pieces 12 can be reduced by the amount equivalent to the weight of the holding plate 14. Therefore, the shape of the metal piece 12 can be designed relatively freely without being subject to strict limitations from the weight of the metal piece 12. By the reduction of the weight of the metal piece 12, its height can be decreased, and furthermore, because all metal pieces 12 are held by the holding plate 14, the stability of their posture can be improved, so that it becomes possible to temporarily position the metal pieces at appropriate positions more securely.

The metal pieces 12 on the holding plate 14 can be formed at appropriate positions relatively easily and accurately by photolithography and etching or plating, for example.

A third embodiment of the present invention will then be described.

Figure 6:
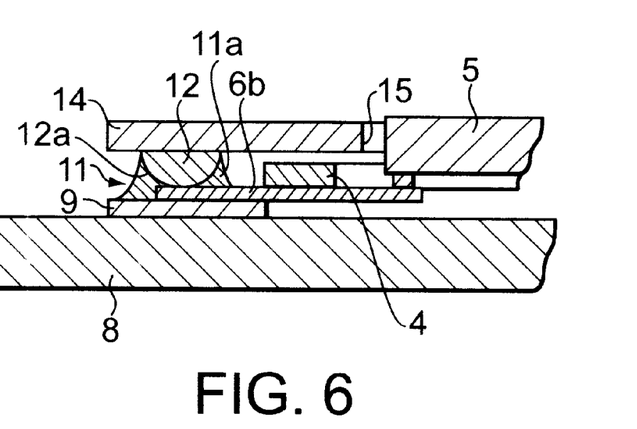
FIG. 6 is similar to FIG. 5(a), showing a third embodiment of the present invention.

As shown in FIG. 6, each metal piece 12 attached to the holding plate 14 has a partially convex spherical surface 12*a* and contacts at its spherical surface 12*a* to the lead 6*b*.

Therefore, the metal piece 12 contacting at its spherical surface to the lead 6*b* can enhance the creep-up effect by interfacial tension of a molten bonding agent 11. Therefore, a larger fillet 11*a* can be formed to further increase the bonding strength.

A fourth embodiment of the present invention will be described.

Figure 7:
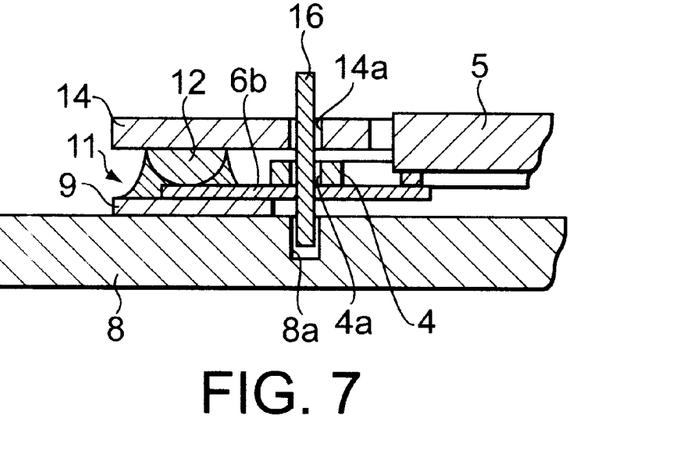
FIG. 7 is similar to FIG. 5(a), showing a fourth embodiment of the present invention.

In the example shown in FIG. 7, a plurality of positioning holes 14*a* are formed in the holding plate 14, to which the metal pieces 12 each having a spherical surface have been attached. Positioning holes 4*a* aligned with the positioning holes 14*a* are formed in the base film portion 4, or the film 4 of TCP 7. Also in the circuit board 8, there are provided positioning holes 8*a* which are aligned with the positioning holes 14*a* and 4*a* to enable the leads 6*b* on the base film portion 4 and the metal pieces 12 on the holding plate 14 to be aligned with the corresponding bonding pads 9 when they are mounted. The positioning hole 8*a*, which is a blind hole in FIG. 7, may be a through-hole.

In the fourth embodiment, as the positioning holes 14a, 4a, and 8a in the plates 14, 4 and 8 are aligned, the leads 6b on the base film 4 and the metal pieces 12 on the holding plate 14 are respectively aligned with the bonding pads 9 of the circuit board 8. To achieve the above-mentioned matching, a pin 16 is inserted into each set of the positioning holes 14a, 4a and 8a. By the use of this pin 16, accurate positioning of the circuit board 8, the film 4, and the holding plate 14 can be done relatively easily.

After the circuit board 8, the film 4, and the holding plate 14 are positioned, they can be sent to the reflow oven 13, with the pins 16 removed. However, the circuit board 8, the film 4, and the holding plate 14 are preferably sent to the reflow oven 13 under the condition that they are combined together with the pins still inserted in the holes 8a, 4a, and 14a.

The pins 16 may be removed after the leads 6b and the bonding pads 9 are respectively connected.

A fifth embodiment of the present invention will now be described.

Figure 8A:
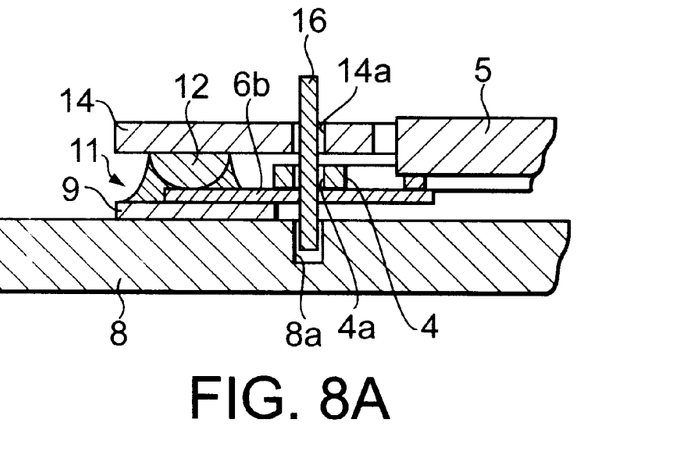
FIG. 8(a) shows the condition that the positioning pin 16 has been mounted to FIG. 5(a)
Figure 8B:
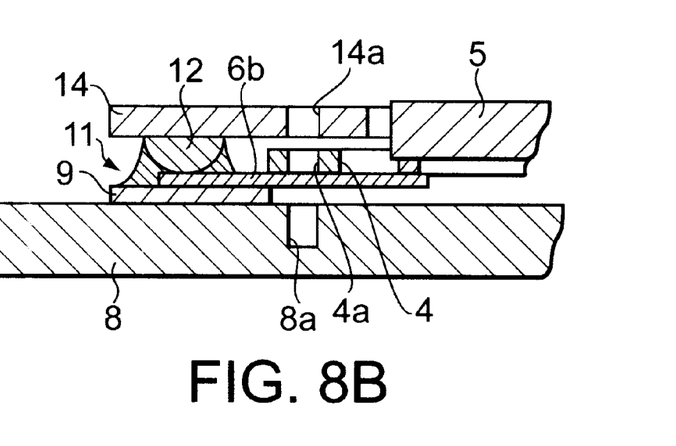
FIG. 8(b) shows the condition that the positioning pin 16 has been removed and resembles FIG. 5(a)

FIG. 8(a) shows the condition that the positioning pin 16 has been mounted to FIG. 5(a), and FIG. 8(b) shows the condition that the positioning pin 16 has been removed, and in this respect, resembles FIG. 5(a).

In a fifth embodiment in FIG. 8, the metal piece 12 is removably held by the holding plate 14. To separatably hold the metal piece 12, a holding plate 14 formed by depositing an indium oxide film to a glass substrate, for example, may be used. For the metal piece 12, gold may be used, for example. Any other adequate combination of the holding plate 14 and the metal piece 12 may be selected.

As shown in FIG. 8(a), the holding plate 14 separatably holding metal pieces 12, the film 4, and the circuit board 8 are sent to the reflow oven 13 under the condition that pins 16 are inserted in the holes 14a, 4a, and 8a. It never occurs that the metal pieces 12 separate from the holding plate 14 by vibration or the like during transportation. Therefore, the leads 6b are securely connected to the bonding pads 9 by reflow soldering in the reflow oven 13 under the condition that the leads 6b are securely positioned by the weight-adding function of the metal pieces 12 and the holding plate 14.

After this, as shown in FIG. 8(b), though this is not illustrated, the pins 16 are removed, and the holding plate 14 is separated from the metal pieces 12 fixed to the leads by solidification of the bonding agent 11. In this way, the holding plate 14 can be separated relatively easily without destroying the connections formed by the bonding agent 11.

According to the fifth embodiment, since the holding plate 14 and the pins are removed after TCP 7 is mounted to the circuit board 8, the weight of the circuit board 8 on which TCP 7 is mounted can be decreased without sacrificing the advantage mentioned in the second embodiment.

The metal pieces 12 can be formed at desired positions on the holding plate 14 by electrolytic plating utilizing masking technology, so that the holding plate 14 can be used over and over again, which is favorable for recycling of resources.

A sixth embodiment of the present invention will be described as follows.

Figure 9:
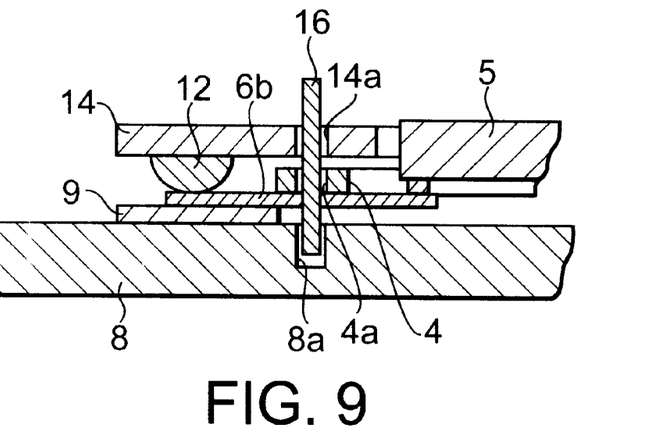
FIGS. 9 and 10 are similar to FIG. 5(a), respectively showing a sixth and a seventh embodiment of the present invention.

In the sixth embodiment shown in FIG. 9, a case is introduced in which the metal pieces 12 shown in the first through fifth embodiments are composed of a bonding agent 11.

By using metal pieces 12 composed of a bonding agent 11, the process of arranging a bonding agent 11, which is separate from the arrangement of metal pieces 12, can be done away with.

The metal piece 11 itself composed of a bonding agent 12 melts during heating in the reflow oven 13, and by subsequent solidification of the molten metal piece 12, the metal piece 12 firmly connects the lead 6b with the bonding pad 9.

The metal pieces 12 composed of a bonding agent 11 can be formed by applying a solder paste, for example, to predetermined positions on the holding plate 14.

By forming the metal pieces 12 of a meltable bonding agent 11, all metal pieces 12 can be melted by the reflow oven 13. For this reason, even if variations occur in the height of the metal pieces 12 as they melt, since the holding plate 14 sinks by its own weight attending on the melting of the metal pieces 12, all metal pieces 12 can be brought into secure contact with the corresponding leads 6b. Therefore, all leads 6b and bonding pads 9 can be connected with high reliability.

A seventh embodiment of the present invention will next be described.

Figure 10:
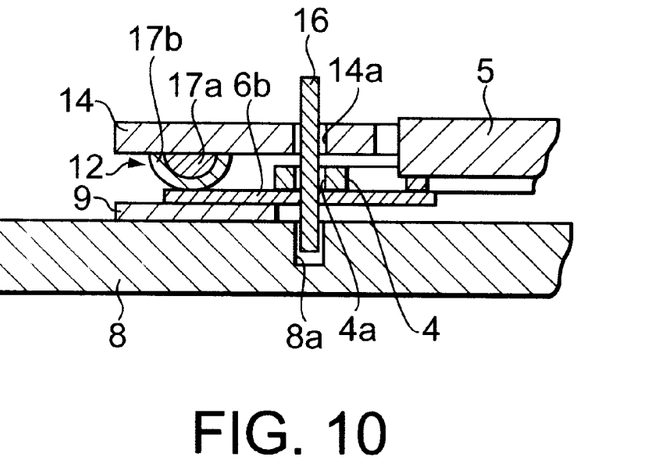

In the seventh embodiment, as shown in FIG. 10, the metal piece 12 has a dual structure including a core 17a and a shell 17b covering the core 17a.

The core 17a may be composed of a metallic material, such as copper, which does not melt by heat in the reflow oven 13, and the shell 17b may be a plated layer or the like formed by using molten solder.

In the seventh embodiment, since the core 17a as a metal piece is coated with the shell 17b of a bonding agent 11 in advance, the process of arranging the bonding agent 11 can be omitted as in the sixth embodiment.

Further, since the core 17a does not melt, the outer lead 6b can be prevented from sinking into the molten metal piece 12 composed entirely of a meltable metal, so that faulty connections resulting from this sinking phenomenon can be securely prevented.

Finally, an eighth embodiment of the present invention will be described.

Figure 11:
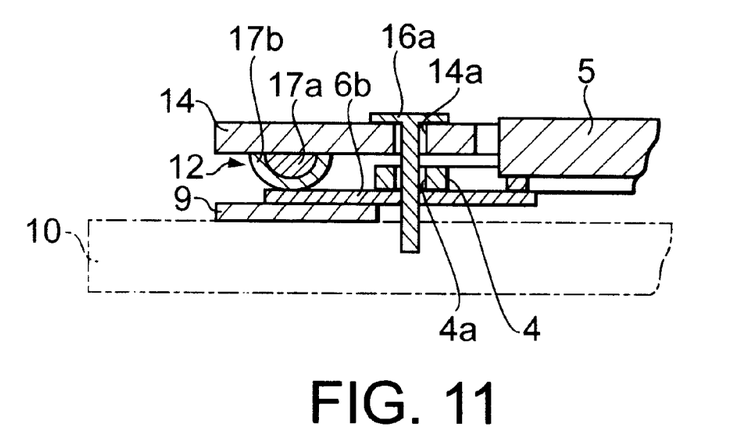
FIG. 11 is a sectional view showing a part of the semiconductor device in an eighth embodiment of the present invention.

In the eighth embodiment, as shown in FIG. 11, the holding plate 14 on which metal pieces 12 are mounted and the film 4 to which both an IC chip 5 and outer leads 6b have been attached, are connected by pins 16 previous to arrangement to the circuit board 8, so that the holding plate 14 and TCP 7 are combined as a unit.

A head portion 16a with a larger diameter than the bore diameter of the positioning hole 14a of the holding plate 14 is formed at one end of the pin 16. The pin 16 is inserted into the positioning hole 14a with the other end passing through it with some clearance provided around the pin. The other end, or the leading end, of the pin passes through the positioning hole 4a of the film 4 and is connected to the film 4, so that the holding plate 14 is movable in the axial direction of the pin 16 between the head portion 16a of the pin 16 and the film 4.

TCP 7 as a combined unit is sent to the reflow oven 13 under the condition that TCP 7 is mounted to the circuit board 8 such that the leading end of the pin 16 is inserted into the positioning hole 8a of the circuit board 8. As the shell 17b of the metal piece 12 starts to melt by the heat of the reflow oven 13, the holding plate 14 holding the metal pieces 12 along with the core 17a sinks toward the outer lead 6b. Therefore, the outer lead 6b and the bonding pad 9 can be securely connected as in the seventh embodiment shown in FIG. 10.

Further, since the holding plate 14 holding metal pieces 12, and TCP 7 are connected by a pin 16 to form a unit, the unit serves to provide a semiconductor device that is easy to handle and permits a reliable and efficient mounting by reflow soldering.

The present invention is not limited by the foregoing embodiments, but various modifications and variations are possible within the spirit of the present invention and without departing from the scope thereof.

What is claimed is:

1. A method of mounting a semiconductor device, including a semiconductor chip and a film having a plurality of leads mounted thereon, to a circuit board, which has provided thereon bonding pads, comprising:

arranging a meltable bonding material on said bonding pads;

arranging said plurality of leads over corresponding ones of said bonding pads, on said meltable bonding material;

arranging a plurality of weighted pieces, able to be wetted by said bonding material, such that each of said plurality of weighted pieces is positioned on a corresponding one of said plurality of leads over said bonding material;

melting said bonding material by heating said bonding material; and fixing said plurality of leads between said weighted pieces and said corresponding bonding pads by allowing the melted bonding material to solidify.

2. A method according to claim 1, further comprising providing a holding plate, wherein the plurality of weighted pieces are held by the holding plate such that said each of the plurality of weighted pieces is disposed above said corresponding one of said plurality of leads, and wherein arranging said plurality of metal pieces includes arranging said holding plate such that said plurality of weighted pieces are collectively positioned on said corresponding ones of said plurality of leads.

3. A method according to claim 1, wherein each of said plurality of weighted pieces has a convex spherical surface in contact with said corresponding one of said plurality of leads when said plurality of weighted pieces is arranged.

4. A method according to claim 2, further comprising:

forming a first hole in said holding plate, forming a second hole in said film, wherein arranging said holding plate includes aligning said first hole and said second hole, forming a third hole in said circuit board, wherein arranging said plurality of leads includes aligning said second hole and said third hole, and disposing a pin through said first, second, and third holes, prior to fixing said leads between said weighted pieces and said corresponding bonding pads.

5. A method according to claim 2, wherein said plurality of weighted pieces are removably held by said holding plate, further comprising removing said holding plate from said plurality of weighted pieces, after fixing said leads.

6. A method according to claim 1, wherein said plurality of weighted pieces are formed of a material that is the same as said bonding material, and wherein said bonding material melts when heated to a first temperature, and the melted bonding material solidifies when cooled to a second temperature.

7. A method according to claim 1, wherein said weighted pieces have a dual structure including:

a core composed of a material that will not melt when heated to a temperature at which said bonding material is melted, and a shell covering the core and composed of a material that is the same as the bonding material, so that the shell melts when the bonding material is melted by heating, and the melted shell solidifies when cooled.

8. A method according to claim 1, wherein said bonding material is solder.

9. A method according to claim 8, wherein said solder is formed of a tin-lead alloy, and said plurality of weighted pieces are formed of a metallic material selected from among copper, gold, and silver.

10. A method according to claim 8, wherein said solder is formed of silver paste, and said plurality of weighted pieces are formed of silver.

11. A method according to claim 1, wherein arranging the plurality of weighted pieces includes positioning each of said plurality of weighted pieces on an end of a corresponding one of said plurality of leads.

12. A method according to claim 1, wherein arranging the plurality of weighted pieces includes positioning each of said plurality of weighted pieces in contact with a surface of a corresponding one of said plurality of leads.

13. A method according to claim 1, wherein said plurality of weighted pieces are made of metal.

14. A method according to claim 1, wherein melting said bonding material includes passing said semiconductor device and said circuit board together through a heating zone to heat said bonding material while said plurality of leads is arranged on said meltable bonding material.

15. A method according to claim 1, wherein fixing said leads between said weighted pieces and said corresponding bonding pads includes allowing the melted bonding material to wet said corresponding weighted pieces, and cooling the melted bonding material to form solid fillets of the bonding material, wherein the solid filets adhere to the weighted pieces and the corresponding bonding pads to fix said plurality of leads therebetween.

16. A method of mounting a semiconductor device, including a semiconductor chip and a film having a plurality of leads mounted thereon, to a circuit board, which has provided thereon bonding pads, comprising:

arranging a meltable bonding material on said bonding pads;

arranging said plurality of leads over corresponding ones of said bonding pads, on said meltable bonding material;

arranging a plurality of weighted pieces, able to be wetted by said bonding material, such that each of said plurality of weighted pieces is positioned on a corresponding one of said plurality of leads over said bonding material;

melting said bonding material by heating said bonding material; and fixing said plurality of leads between said weighted pieces and said corresponding bonding pads by allowing the melted bonding material to solidify wherein said plurality of weighted pieces are formed of a material that is the same as said bonding material, and wherein said bonding material melts when heated to a first temperature, and the melted bonding material solidifies when cooled to a second temperature.

17. A method of mounting a semiconductor device, including a semiconductor chip and a film having a plurality of leads mounted thereon, to a circuit board, which has provided thereon bonding pads, comprising:

arranging a meltable bonding material on said bonding pads;

arranging said plurality of leads over corresponding ones of said bonding pads, on said meltable bonding material;

arranging a plurality of weighted pieces, able to be wetted by said bonding material, such that each of said plurality of weighted pieces is positioned on a corresponding one of said plurality of leads over said bonding material;

melting said bonding material by heating said bonding material; and fixing said plurality of leads between said weighted pieces and said corresponding bonding pads by allowing the melted bonding material to solidify wherein said weighted pieces have a dual structure including:

a core composed of a material that will not melt when heated to a temperature at which said bonding material is melted, and a shell covering the core and composed of a material that is the same as the bonding material, so that the shell melts when the bonding material is melted by heating, and the melted shell solidifies when cooled.

* * * * *